United States Patent
Zeng

(10) Patent No.: US 11,841,627 B2
(45) Date of Patent: Dec. 12, 2023

(54) DISPLAY PANEL TEST METHOD COMPRISING THE STEP OF AUTOMATICALLY SEARCHING FOR AN ALIGNMENT MARK BY OBTAINING POSITION INFORMATION OF THE DISPLAY PANEL AND DISPLAY PANEL TEST DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Zanting Zeng, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 337 days.

(21) Appl. No.: 17/419,716

(22) PCT Filed: Dec. 18, 2020

(86) PCT No.: PCT/CN2020/137552
§ 371 (c)(1),
(2) Date: Jun. 30, 2021

(87) PCT Pub. No.: WO2021/208478
PCT Pub. Date: Oct. 21, 2021

(65) Prior Publication Data
US 2022/0404723 A1 Dec. 22, 2022

(30) Foreign Application Priority Data
Apr. 14, 2020 (CN) .......... 202010291069.X

(51) Int. Cl.
*G03F 9/00* (2006.01)
*G02F 1/1333* (2006.01)

(52) U.S. Cl.
CPC ...... *G03F 9/7088* (2013.01); *G02F 1/133354* (2021.01); *G03F 9/7084* (2013.01)

(58) Field of Classification Search
CPC . G03F 9/7084; G03F 1/44; G03F 1/42; G02F 2203/69
See application file for complete search history.

(56) References Cited

U.S. PATENT DOCUMENTS

2009/0316080 A1* 12/2009 Uehara ............ G02F 1/133351
349/187
2010/0321655 A1* 12/2010 Tanaka ............... G03B 27/42
355/53
(Continued)

FOREIGN PATENT DOCUMENTS

CN 101487985 A 7/2009
CN 101593480 A 12/2009
(Continued)

OTHER PUBLICATIONS

International Search Report in International application No. PCT/CN2020/137552, dated Mar. 17, 2021.
(Continued)

*Primary Examiner* — Paul C Lee
(74) *Attorney, Agent, or Firm* — PV IP PC; Wei Te Chung; Zhigang Ma

(57) ABSTRACT

The present application provides a display panel test method and a display panel test device. The display panel test method automatically searches for an alignment mark of a display panel. After the alignment mark is automatically found, a position of the alignment mark can be adjusted automatically. The alignment mark of the display panel can also be adjusted manually when the position of the align-
(Continued)

ment mark of the display panel cannot be automatically adjusted. Therefore, there is no need to conduct monitoring by manpower. After the alignment mark is found, there is no need to remove the display panel.

20 Claims, 5 Drawing Sheets

(56) References Cited

U.S. PATENT DOCUMENTS

| | | | |
|---|---|---|---|
| 2017/0261868 A1* | 9/2017 | Lu | G03F 9/7076 |
| 2019/0179206 A1* | 6/2019 | Cao | G02F 1/136286 |
| 2019/0235288 A1* | 8/2019 | Chen | G03F 9/00 |

FOREIGN PATENT DOCUMENTS

| | | |
|---|---|---|
| CN | 103034071 A | 4/2013 |
| CN | 105182702 A | 12/2015 |
| CN | 105589230 A | 5/2016 |
| CN | 106875841 A | 6/2017 |
| CN | 108036932 A | 5/2018 |
| CN | 108318504 A | 7/2018 |
| CN | 110780476 A | 2/2020 |
| CN | 111442906 A | 7/2020 |
| JP | 2006294993 A | 10/2006 |
| JP | 2019074323 A | 5/2019 |

OTHER PUBLICATIONS

Written Opinion of the International Search Authority in International application No. PCT/CN2020/137552, dated Mar. 17, 2021.
Chinese Office Action issued in corresponding Chinese Patent Application No. 202010291069 X dated Mar. 3, 2021, pp. 1-7.

* cited by examiner

DISPLAY PANEL TEST METHOD COMPRISING THE STEP OF AUTOMATICALLY SEARCHING FOR AN ALIGNMENT MARK BY OBTAINING POSITION INFORMATION OF THE DISPLAY PANEL AND DISPLAY PANEL TEST DEVICE

CROSS REFERENCE TO RELATED APPLICATION

This application is a National Phase application of PCT Patent Application No. PCT/CN2020/137552 having International filing date of Dec. 18, 2020.

FIELD OF DISCLOSURE

The present application relates to a field of display technology and in particular, to a display panel test method and a display panel test device.

DESCRIPTION OF RELATED ART

In conventional manufacturing processes of display panels, it is necessary to test quality of the display panels to avoid problems such as poor display performance and damage to the display panel during use, so as to ensure the quality of the display panels. In a process of testing the display panels, a test element group (TEG) is an important machine for a yield test. In a process of using the TEG, it is necessary to find and align a mark. This process requires monitoring by manpower, and technical problems like failing to find the mark may occur. After failure to find the mark, the panel needs to be removed from a machine, then reloaded into the machine, and then tested again, which increases workloads and has lower efficiency, resulting in lower efficiency in manufacturing the display panel.

Therefore, in the conventional process of testing the display panel, after failure to find the mark, operations need to be repeated, which leads to the technical problem of lower efficiency in manufacturing the display panel.

SUMMARY

The present application provides a display panel test method and a display panel test device, which are used to solve a technical problem that repeated operations are required after failure to find a mark in a conventional display panel test process, resulting in lower efficiency in manufacturing the display panel.

In order to solve the above-mentioned problem, the present application provides following solutions:

The present application provides a display panel test method, comprising following steps:
  obtaining position information of a display panel;
  automatically searching for an alignment mark on the display panel according to the position information of the display panel;
  determining whether to allow automatic searching again for the alignment mark on the display panel when the alignment mark on the display panel is not found;
  searching again for the alignment mark on the display panel when automatically searching again for the alignment mark on the display panel is allowed;
  issuing a first warning when a number of times of searching again for the alignment mark on the display panel is greater than a preset value;
  choosing to search again for the alignment mark on the display panel or proceeding to a next operation after the first warning is issued;
  manually adjusting a position of the alignment mark on the display panel after choosing to proceed to the next operation; and
  performing a test process after the alignment mark on the display panel is successfully aligned.

In some embodiments, the step of obtaining the position information of the display panel comprises:
  searching for the display panel at a specific frequency; and
  obtaining the position information of the display panel when the display panel enters a test range.

In some embodiments, the step of automatically searching for the alignment mark on the display panel according to the position information of the display panel comprises:
  determining coordinates of the display panel according to the position information of the display panel;
  setting a search rule according to the coordinates of the display panel; and
  automatically searching for the alignment mark on the display panel according to the search rule.

In some embodiments, after the step of determining whether to allow automatically searching again for the alignment mark on the display panel, when the alignment mark on the display panel is not found, the display panel test method further comprises:
  choosing to proceed to the next operation when automatically searching again for the alignment mark on the display panel is forbidden.

In some embodiments, the step of determining whether to allow automatic searching again for the alignment mark on the display panel when the alignment mark on the display panel is not found comprises:
  issuing a second warning when the alignment mark on the display panel is not found; and
  determining whether to allow automatically searching again for the alignment mark on the display panel after the second warning is received.

In some embodiments, the step of issuing the second warning when the alignment mark on the display panel is not found comprises:
  displaying different colors on data when the alignment mark on the display panel is not found.

In some embodiments, the step of issuing the second warning when the alignment mark is not found further comprises:
  proceeding to the next operation after the second warning is received.

In some embodiments, after the step of searching again for the alignment mark on the display panel when automatically searching again for the alignment mark on the display panel is allowed, the display panel test method further comprises:
  searching again for the alignment mark on the display panel when the number of times of searching again for the alignment mark on the display panel is less than or equal to the preset value.

In some embodiments, after the step of searching again for the alignment mark on the display panel, when automatically searching again for the alignment mark on the display panel is allowed, the display panel test method further comprises:

recording coordinates of the alignment mark on the display panel after the alignment mark on the display panel is found; and automatically adjusting the position of the alignment mark on the display panel after the coordinates of the alignment mark on the display panel are recorded.

In some embodiments, after the step of adjusting the position of the alignment mark on the display panel after the coordinates of the alignment mark of the display panel are recorded, the display panel test method further comprises:

determining a search range;

matching parameters of the alignment mark on the display panel according to the search range; and confirming that the display panel is fixed when the parameters of the alignment mark on the display panel match correctly.

In some embodiments, after the step of choosing to search again for the alignment mark on the display panel or proceeding to the next operation after the first warning is issued, the display panel test method further comprises:

automatically searching for the alignment mark on the display panel after choosing to search again for the alignment mark on the display panel.

In some embodiments, the step of manually adjusting the position of the alignment mark on the display panel after choosing to proceed to the next operation comprises:

adjusting the position of the alignment mark on the display panel;

determining coordinates of the alignment mark on the display panel after the position of the alignment mark on the display panel is adjusted; and searching again for the alignment mark on the display panel after coordinates of the display panel are determined.

In some embodiments, after the step of determining the coordinates of the alignment mark on the display panel after the position of the alignment mark on the display panel is adjusted, the display panel test method further comprises:

correcting previous coordinates of the alignment mark on the display panel according to the coordinates of the alignment mark on the display panel.

In some embodiments, after the step of searching again for the alignment mark on the display panel after the coordinates of the display panel are determined, the display panel test method further comprises:

performing a test process after the alignment mark on the display panel is found again.

The present application also provides a display panel test device, comprising:

a position information acquisition module configured to obtain position information of the display panel;

a first search module configured to automatically search for an alignment mark on the display panel according to the position information of the display panel;

a judging module configured to determine whether to allow automatic searching again for the alignment mark on the display panel when the alignment mark on the display panel is not found;

a second search module configured to search again for the alignment mark on the display panel when automatically searching again for the alignment mark on the display panel is allowed;

a first warning module configured to issue a first warning when a number of times of searching again for the alignment mark on the display panel is greater than a preset value;

a selection module configured to choose to search again for the alignment mark on the display panel or proceeding to a next operation after the first warning is issued;

a manual adjustment module configured to manually adjust a position of the alignment mark on the display panel after choosing to proceed to the next operation; and a test module configured to perform a test process after the alignment mark on the display panel is successfully aligned.

In one embodiment, the position information acquisition module is configured to search for the display panel at a specific frequency; and the position information of the display panel is obtained when the display panel enters a test range.

In one embodiment, the first search module is configured to determine coordinates of the display panel according to the position information of the display panel, set a search rule according to the coordinates of the display panel, and automatically search for the alignment mark on the display panel according to the search rule.

In one embodiment, the judging module is configured to choose to proceed to the next operation when automatically searching again for the alignment mark on the display panel is forbidden.

In one embodiment, the judging module is configured to issue a second warning when the alignment mark on the display panel is not found, and determine whether to allow automatic searching again for the alignment mark on the display panel when the second warning is received.

In one embodiment, the judging module is configured to display different colors on data when the alignment mark on the display panel is not found.

Advantages of the Present Application

The present application provides a display panel test method and a display panel test device. The display panel test method comprises: obtaining position information of a display panel; automatically searching for an alignment mark on the display panel according to the position information of the display panel; determining whether to allow automatic searching again for the alignment mark on the display panel when the alignment mark on the display panel is not found; searching again for the alignment mark on the display panel when automatically searching again for the alignment mark on the display panel is allowed; issuing a first warning when a number of times of searching again for the alignment mark on the display panel is greater than a preset value; choosing to search again for the alignment mark on the display panel or proceeding to a next operation after the first warning is issued; manually adjusting a position of the alignment mark on the display panel after choosing to proceed to the next operation; and performing a test process after the alignment mark on the display panel is successfully aligned. The present application automatically searches for the alignment mark of the display panel, and can automatically adjust the position of the alignment mark of the display panel after the alignment mark of the display panel is automatically found. The alignment mark of the display panel can be manually adjusted when the position of the alignment mark of the display panel cannot be adjusted automatically. As a result, there is no need to conduct monitoring by manpower. In addition to that, after the alignment mark is found, there is no need to remove the display panel, and the position of the alignment mark can be directly adjusted automatically or adjusted manually, thereby reducing manpower and eliminating a need to repeatedly remove and then reload the display panel. This solves a technical problem that repeated operations are required after failure to find a mark in a conventional display panel test process, which leads to low efficiency in manufacturing the display panel.

DETAILED DESCRIPTION OF EMBODIMENTS

The present application provides a display panel test method and a display panel test device. In order to make purposes, technical solutions, and functions of the present application more clear and definite, the present application is further described in detail below with reference to the accompanying drawings and embodiments. It should be understood that the specific embodiments described herein are only used to explain the present application, and are not used to limit the present application.

The present application is directed to solving a technical problem that operations need to be repeated after failure to find a mark in a conventional display panel test process, resulting in low efficiency in manufacturing display panels. The present application can solve this problem.

Figure 1:
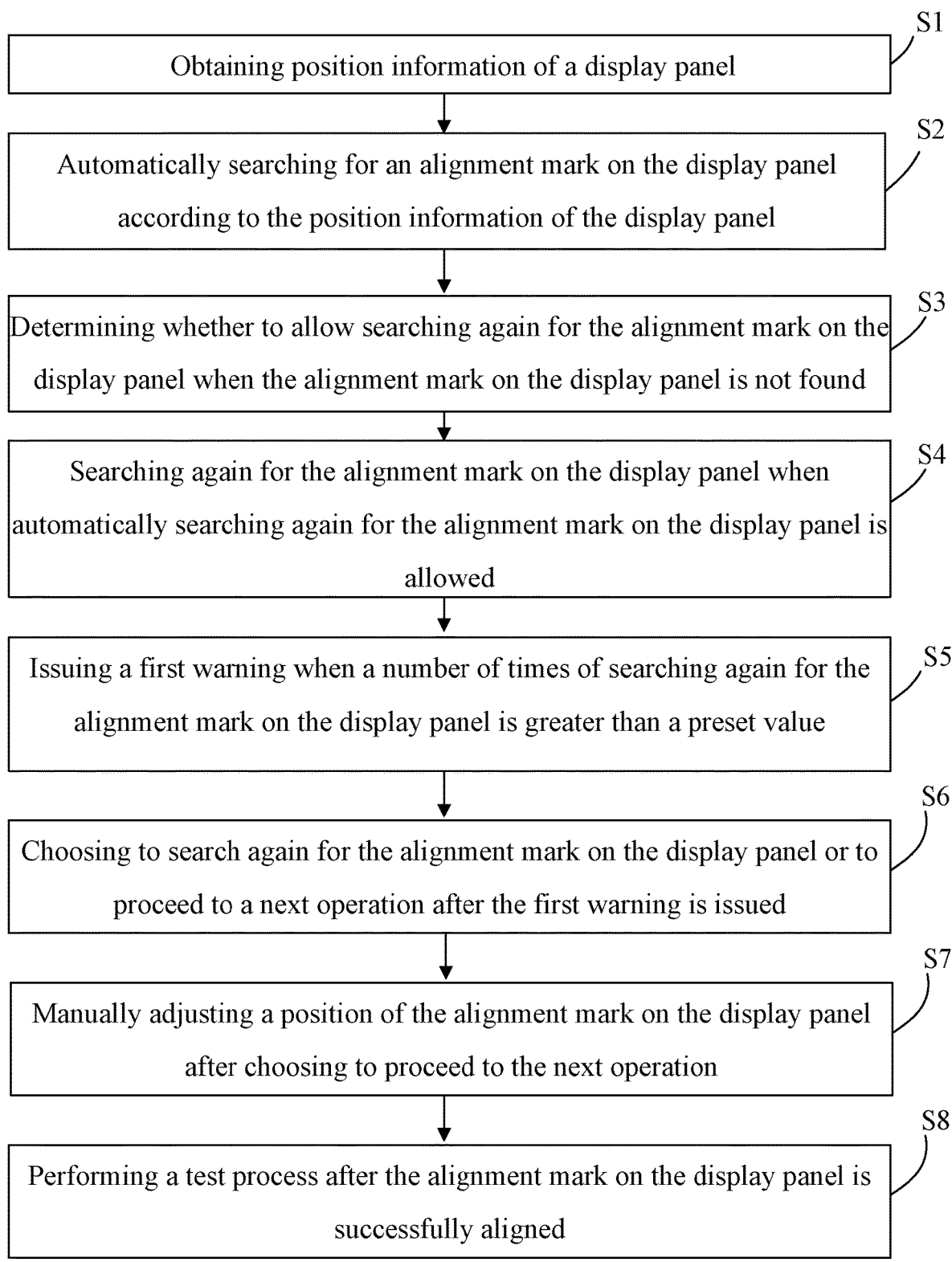
FIG. 1 is a first schematic diagram illustrating a display panel test method according to one embodiment of the present application.

As shown in FIG. 1, the present application provides a display panel test method, comprising following steps:

S1: obtaining position information of a display panel;

S2: automatically searching for an alignment mark on the display panel according to the position information of the display panel;

S3: determining whether to allow searching again for the alignment mark on the display panel when the alignment mark on the display panel is not found;

S4: searching again for the alignment mark on the display panel when automatically searching again for the alignment mark on the display panel is allowed;

S5: issuing a first warning when a number of times of searching again for the alignment mark on the display panel is greater than a preset value;

S6: choosing to search again for the alignment mark on the display panel or proceeding to a next operation after the first warning is issued;

S7 manually adjusting a position of the alignment mark on the display panel after choosing to proceed to the next operation; and S8: performing a test process after the alignment mark on the display panel is successfully aligned.

The present application provides a display panel test method, comprising: obtaining position information of a display panel; automatically searching for an alignment mark on the display panel according to the position information of the display panel; determining whether to allow automatic searching again for the alignment mark on the display panel when the alignment mark on the display panel is not found; searching again for the alignment mark on the display panel when automatically searching again for the alignment mark on the display panel is allowed; issuing a first warning when a number of times of searching again for the alignment mark on the display panel is greater than a preset value; choosing to search again for the alignment mark on the display panel or proceeding to a next operation after the first warning is issued; manually adjusting a position of the alignment mark on the display panel after choosing to proceed to the next operation; and performing a test process after the alignment mark on the display panel is successfully aligned. The present application automatically searches for the alignment mark of the display panel, and automatically adjusts the position of the alignment mark of the display panel after the alignment mark of the display panel is automatically found. The alignment mark of the display panel can be manually adjusted when the position of the alignment mark of the display panel cannot be adjusted automatically. Accordingly, there is no need to conduct monitoring by manpower. In addition to that, after the alignment mark is found, there is no need to remove the display panel, and the position of the alignment mark can be directly adjusted automatically or adjusted manually, thereby reducing manpower and eliminating a need to repeatedly remove and then reload the display panel. This solves a technical problem that repeated operations are required after failure to find a mark in a conventional display panel test process, which leads to low efficiency in manufacturing the display panel.

According to one embodiment, the step of obtaining the position information of the display panel comprises:

searching for the display panel at a specific frequency; and obtaining the position information of the display panel when the display panel enters a test range. In detail, before testing the display panel, it is required to determine whether the display panel is within the test range. The specific frequency can be set to find whether the display panel enters the test range. For example, the specific frequency is set to search once per minute. After the display panel enters the test range, the position information of the display panel is determined accordingly, such as coordinates of the display panel or a distance from an upper or lower side of the display panel to the test range.

In one embodiment, in the process of automatically searching for the alignment mark of the display panel according to the position information of the display panel, the present application adds an automatic search function to directly search for the alignment mark of the display panel. Therefore, there is no need to conduct searching by personnel, and manpower can be reduced.

In one embodiment, the step of automatically searching for the alignment mark on the display panel according to the position information of the display panel comprises:

determining the coordinates of the display panel according to the position information of the display panel;

setting a search rule according to the coordinates of the display panel; and automatically searching for the alignment mark on the display panel according to the search rule. After the coordinates of the display panel are determined according to the position information of the display panel, the alignment mark can be searched according to the coordinates of the display panel. For example, the search rule is set to search for the alignment mark within a range of 1 mm to 3 mm from a lower end of the display panel, and search in an order from left to right, then from top to bottom, so as to find the alignment mark of the display panel in this range, and can also be set to search for the alignment mark in another range in another order.

It should be noted that the coordinates of the display panel are coordinates at a certain position, a certain side, or an end point on the display panel.

In one embodiment, the step of judging whether to allow automatic searching again for the alignment mark on the display panel, when the alignment mark on the display panel is not found, also comprises:

choosing to proceed to the next operation when automatically searching again for the alignment mark on the display panel is forbidden.

When the alignment mark on the display panel is not found, in order to avoid increasing a search time, automatically searching again for the alignment mark of the display panel can be forbidden, and other means are used instead to search and adjust the alignment mark of the display panel.

In one embodiment, the step of judging whether to allow automatic searching again for the alignment mark on the display panel when the alignment mark on the display panel is not found comprises:

issuing a second warning when the alignment mark on the display panel is not found; and determining whether to allow automatic searching again for the alignment mark on the display panel after the second warning is received.

When the alignment mark on the display panel is not found, the second warning can be issued, so that the personnel know that the search for the alignment mark fails, and can accordingly carry out the next process, and after knowing the failure in searching the alignment mark, it can be determined whether to allow automatic searching again for the alignment mark on the display panel.

In one embodiment, the step of issuing the second warning when the alignment mark on the display panel is not found comprises:

displaying different colors on data when the alignment mark on the display panel is not found.

Figure 2:
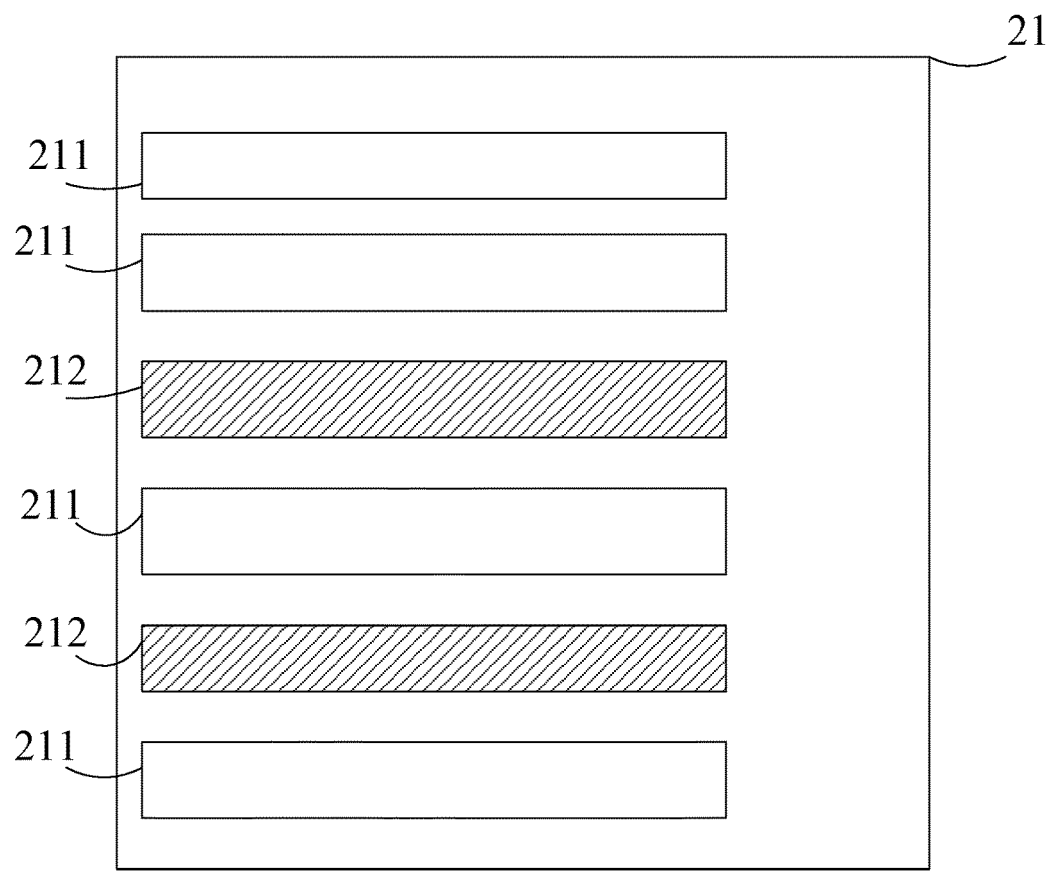
FIG. 2 is a first schematic view illustrating a display interface of a display panel test device according to one embodiment of the present application.

As shown in FIG. 2, on a display interface 21, by displaying different colors on the data, the second warning is issued. FIG. 2 is illustrated by different fillings as an example. In FIG. 2, colors of the first data 211 and the second data 212 are different, such that the second warning is issued.

In one embodiment, the step of issuing the second warning when the alignment mark is not found further comprises:

proceeding to the next operation after the second warning is received.

After the second warning is received, in order to avoid increasing the search time for a next search, the next operation can be performed directly, such that other means such as manual search and manual adjustment are used to find the alignment mark and adjust the position of the alignment mark.

In one embodiment, after the step of searching again for the alignment mark on the display panel when automatically searching again for the alignment mark on the display panel is allowed, the display panel test method further comprises:

searching again for the alignment mark on the display panel when the number of times of searching again for the alignment mark on the display panel is less than or equal to the preset value.

After searching again for the alignment mark on the display panel is allowed, when the number of times of searching again for the alignment mark on the display panel is less than or equal to the preset value, it is continued to search for the alignment mark on the display panel. That is to say, before the alignment mark on the display panel is found, if the number of searches is less than the preset value which is 10 for example, then the alignment mark of the display panel is continued to be searched before the alignment mark is searched 10 times.

In one embodiment, after the step of searching again for the alignment mark on the display panel, when automatically searching again for the alignment mark on the display panel is allowed, the display panel test method further comprises:

recording coordinates of the alignment mark on the display panel after the alignment mark on the display panel is found; and automatically adjusting the position of the alignment mark on the display panel after the coordinates of the alignment mark of the display panel are recorded.

After the alignment mark of the display panel is found, the alignment mark of the display panel is recorded, and then the position of the alignment mark is automatically adjusted according to the coordinates of the alignment mark, so that the alignment mark can be aligned.

In one embodiment, after the step of adjusting the position of the alignment mark on the display panel after the coordinates of the alignment mark of the display panel are recorded, the display panel test method further comprises:

determining a search range;

matching parameters of the alignment mark on the display panel according to the search range; and confirming that the display panel is fixed when the parameters of the alignment mark on the display panel match correctly.

Figure 3:
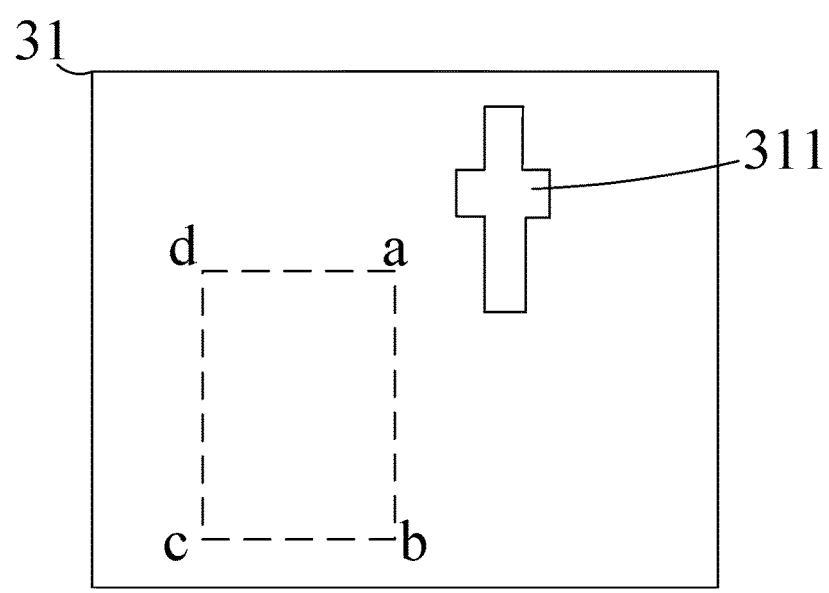
FIG. 3 is a second schematic view illustrating the display interface of the display panel test device according to one embodiment of the present application.

As shown in FIG. 3, in order to prevent the display panel test device from having problems resulting from the alignment mark being unfixed, it is confirmed whether the alignment mark is fixed by matching the parameters of the alignment mark after the alignment mark of the display panel is found and the position of the alignment mark is adjusted. For example, in FIG. 3, in a display interface 31, the search range is a range of a box formed by four points a, b, c, d, and the alignment mark 311 is outside the search range. By determining the parameters between the alignment mark 311 and the four points a, b, c, d, wherein the parameters are distances for example, it can be determined whether the alignment mark 311 is fixed, so as to ensure that the alignment mark 311 is fixed. Certain parameters can be set for testing. For example, the certain parameters can include 6 times of actual alignment, 12 times of aligning the display panel test device, 500 search steps of a single measurement probe, 5 searches performed by the single measurement probe.

In one embodiment, after the step of choosing to search again for the alignment mark on the display panel or proceeding to the next operation after the first warning is issued, the display panel test method further comprises:
   automatically searching for the alignment mark on the display panel after choosing to search again for the alignment mark on the display panel.

After multiple searches to find the alignment mark of the display panel, the first warning is issued, and then the alignment mark of the display panel can be searched again to find the alignment mark of the display panel.

In one embodiment, the step of manually adjusting the position of the alignment mark on the display panel after choosing to proceed to the next operation comprises:
   adjusting the position of the alignment mark on the display panel;
   determining the coordinates of the alignment mark on the display panel after the position of the alignment mark on the display panel is adjusted; and
   searching again for the alignment mark on the display panel after the coordinates of the display panel are determined.

After the position of the alignment mark is adjusted manually, the coordinates of the alignment mark on the display panel can be determined, and then the alignment mark can be searched again, so that the alignment mark can be found, the alignment mark is not moved, and thereby the test process can be performed.

In one embodiment, after the step of determining the coordinates of the alignment mark on the display panel after the position of the alignment mark on the display panel is adjusted, the display panel test method further comprises:
   correcting previous coordinates of the alignment mark on the display panel according to the coordinates of the alignment mark on the display panel.

Figure 4:
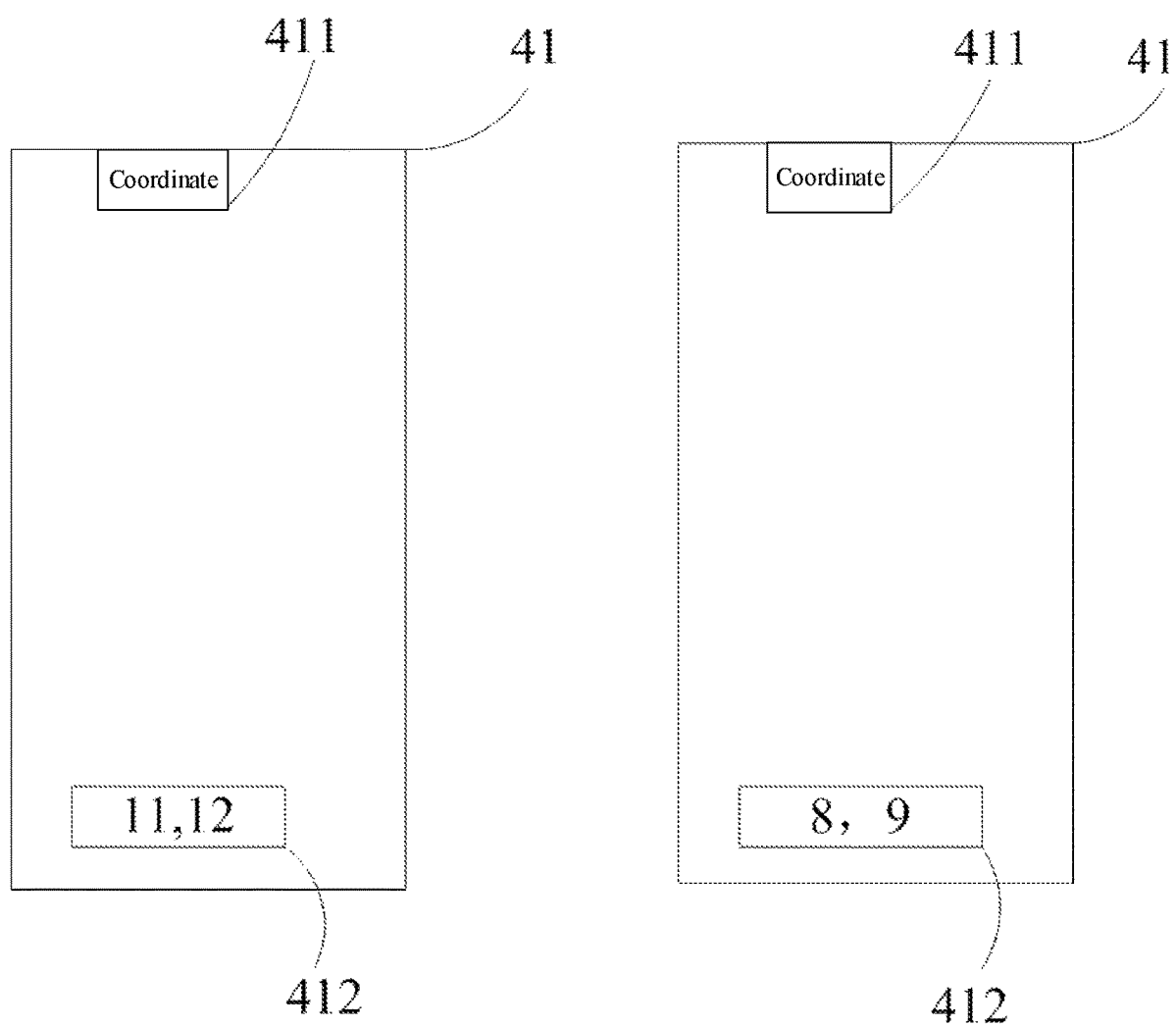
FIG. 4 is a third schematic view illustrating the display interface of the display panel test device according to one embodiment of the present application.

As shown in FIG. 4, in the display interface 41, after the coordinates of the alignment mark of the display panel are determined, the display panel test method can comprise switching to a coordinate selection position 411 in the display interface 41, and modifying previous coordinates 412 of the alignment mark. For example, coordinates (11, 12) are changed to (8, 9) in FIG. 4 to ensure that corresponding data of the alignment mark is correct, and operations can be performed according to the data during the next adjustment or the test process.

It should be noted that the above-mentioned coordinates do not represent the actual coordinates of the alignment mark.

In one embodiment, after the step of searching again for the alignment mark on the display panel after the coordinates of the display panel are determined, the display panel test method further comprises:
   performing the test process after the alignment mark on the display panel is found again.

After the alignment mark of the display panel is found again, it indicates that the position of the alignment mark is correct, and the test process is performed on the display panel.

Figure 5:
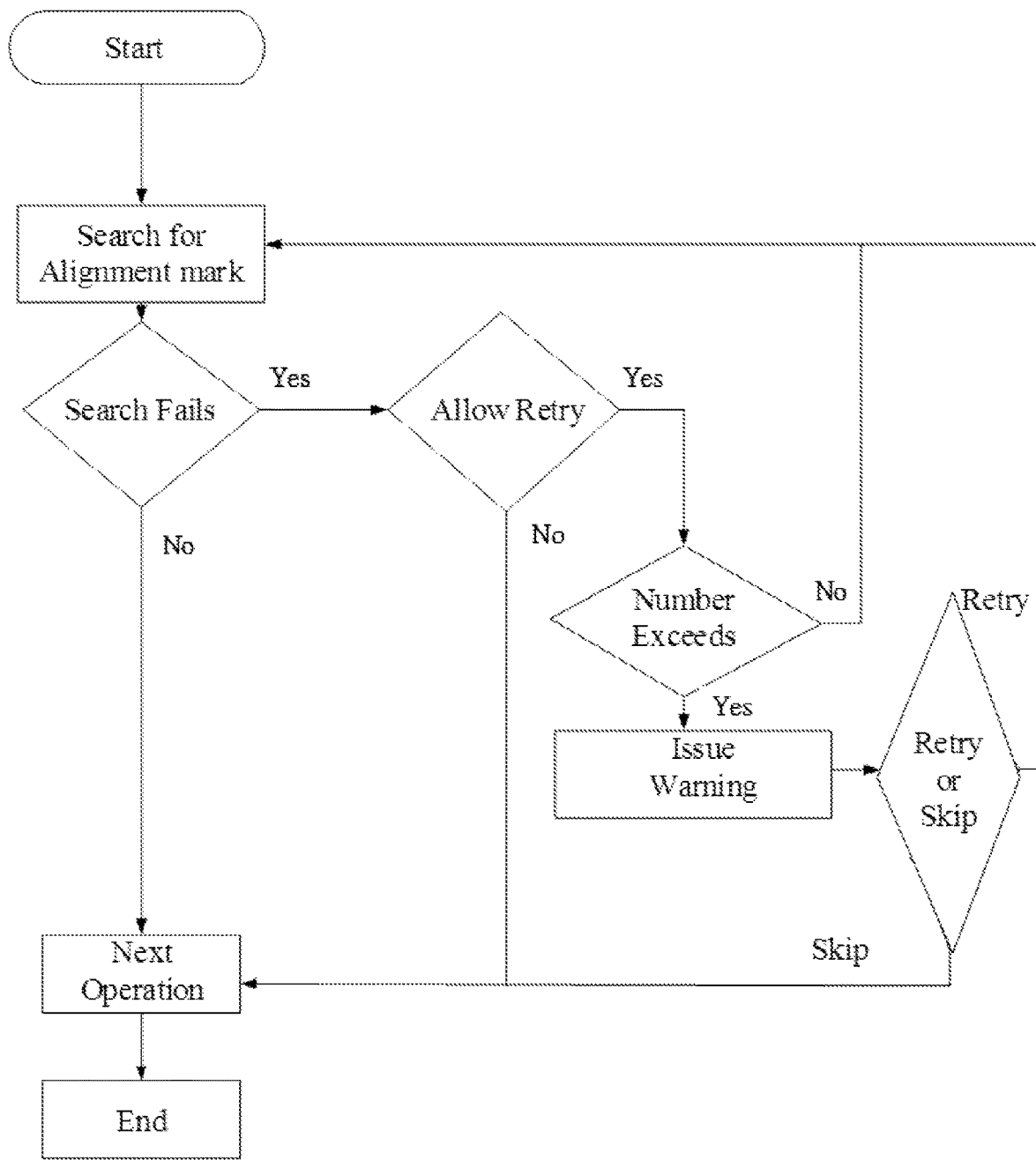
FIG. 5 is a second schematic diagram illustrating the display panel test method according to one embodiment of the present application.

As shown in FIG. 5, the present application provides a display panel test method. The display panel test method comprises a step of starting a test on the display panel and then searching for the alignment mark. In the present application, the alignment mark of the display panel is automatically searched, and then when the search fails, it corresponds to "Yes" on a right side of a "Search Fails" logic box in FIG. 5. Then, it is determined whether to allow retry, which corresponds to an "Allow Retry" logic box in FIG. 5. Alternatively, when the search fails, the next operation is performed, which corresponds to a "Next Operation" logic box in FIG. 5. When retry is allowed, it corresponds to "Yes" on a right side of the "Allow Retry" logic box in FIG. 5 to see whether a preset number of retries is exceeded, which corresponds to an "Number Exceeds" logical box in FIG. 5. When the number of retries is not exceeded, it corresponds to "No" on a right side of the "Number Exceeds" logical box in FIG. 5, and then it is proceeded to search again for the alignment mark. Alternatively, when the retry is not allowed, it corresponds to "No" under the "Allow Retry" logic box in FIG. 5, then it is proceeded to the next operation. When the retry is allowed and the number of retries exceeds the preset number of retries, it corresponds to "Yes" under the "Number Exceeds" logic box in FIG. 5, a warning is issued, which corresponds to "Issue Warning" logic box in FIG. 5. After the warning is issued, it is determined whether to retry or skip, which corresponds to a "Retry or Skip" logic box in FIG. 5. When the retry is chosen, it corresponds to "Retry" on a right side of the "Retry or Skip" logic box in FIG. 5, and then the alignment mark can be searched again. When the skip is chosen, it corresponds to "Skip" under the "Retry or Skip" logic box in FIG. 5, and then it is proceeded to the next operation. After the next operation, the test ends.

Figure 6:
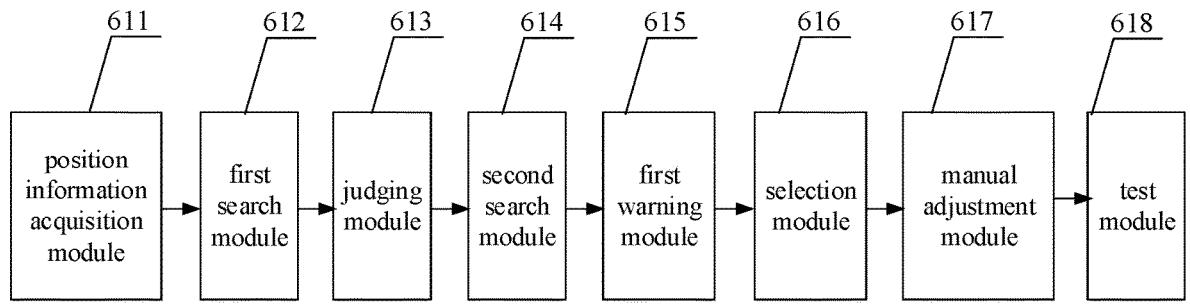
FIG. 6 is a schematic diagram illustrating the display panel test device according to one embodiment of the present application.

As shown in FIG. 6, the present application provides a display panel test device. The display panel test device comprises:
   a position information acquisition module 611 configured to obtain position information of the display panel;
   a first search module 612 configured to automatically search for an alignment mark on the display panel according to the position information of the display panel;
   a judging module 613 configured to determine whether to allow automatic searching again for the alignment mark on the display panel when the alignment mark on the display panel is not found;
   a second search module 614 configured to search again for the alignment mark on the display panel when automatically searching again for the alignment mark on the display panel is allowed;
   a first warning module 615 configured to issue a first warning when a number of times of searching again for the alignment mark on the display panel is greater than a preset value;
   a selection module 616 configured to choose to search again for the alignment mark on the display panel or proceeding to a next operation after the first warning is issued;
   a manual adjustment module 617 configured to manually adjust a position of the alignment mark on the display panel after choosing to proceed to the next operation; and
   a test module 618 configured to perform a test process after the alignment mark on the display panel is successfully aligned.

The present application provides a display panel test device. The display panel test device comprises the position information acquisition module, the first search module, the judging module, the second search module, the first warning module; the selection module; the manual adjustment module, and the test module. The display panel test method comprises obtaining position information of a display panel; automatically searching for an alignment mark on the display panel according to the position information of the display panel; determining whether to allow automatically searching again for the alignment mark on the display panel when the alignment mark on the display panel is not found; searching again for the alignment mark on the display panel when automatically searching again for the alignment mark on the display panel is allowed; issuing a first warning when a number of times of searching again for the alignment mark on the display panel is greater than a preset value; choosing to search again for the alignment mark on the display panel or proceeding to a next operation after the first warning is issued; manually adjusting a position of the alignment mark on the display panel after choosing to proceed to the next operation; and performing a test process after the alignment mark on the display panel is successfully aligned. The present application automatically searches for the alignment mark of the display panel, and automatically adjusts the position of the alignment mark of the display panel after the alignment mark of the display panel is automatically found. The alignment mark of the display panel can be manually adjusted when the position of the alignment mark of the display panel cannot be adjusted automatically. As a result, there is no need to conduct monitoring by manpower. In addition to that, after the alignment mark is found, there is no need to remove the display panel, and the position of the alignment mark can be directly adjusted automatically or adjusted manually, thereby reducing manpower and eliminating a need to repeatedly remove and then reload the display panel. This solves a technical problem that repeated operations are required after failure to find a mark in a conventional display panel test process, which leads to low efficiency in manufacturing the display panel.

In one embodiment, the position information acquisition module is configured to search for the display panel at a specific frequency; and the position information of the display panel is acquired when the display panel enters a test range.

In one embodiment, the first search module is configured to determine coordinates of the display panel according to the position information of the display panel, set a search rule according to the coordinates of the display panel, and automatically search for the alignment mark on the display panel according to the search rule.

In one embodiment, the judging module is configured to choose to proceed to the next operation when automatically searching again for the alignment mark on the display panel is forbidden.

In one embodiment, the judging module is configured to issue a second warning when the alignment mark on the display panel is not found, and determine whether to allow automatic searching again for the alignment mark on the display panel when the second warning is received.

In one embodiment, the judging module is configured to display different colors on data when the alignment mark on the display panel is not found.

Figure 7:
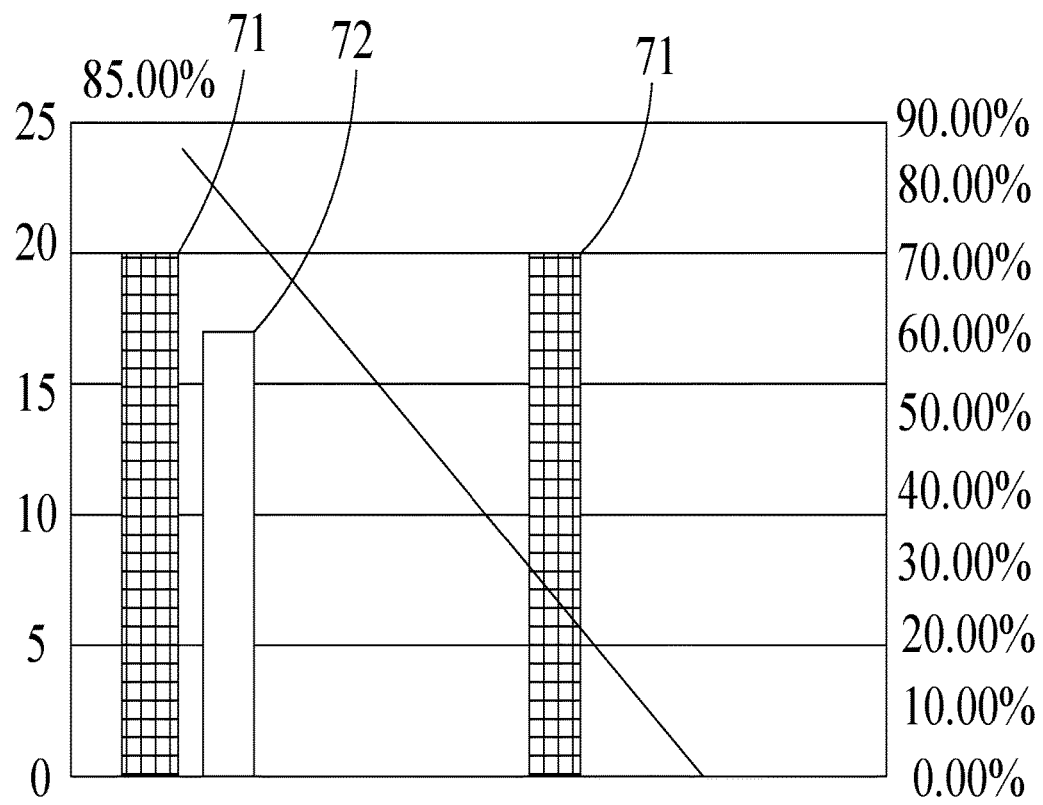
FIG. 7 is a graph illustrating a comparison between a probability of successful alignment in a conventional display panel test device and a probability of successful alignment of the display panel test device according to one embodiment of the present application.

Please refer to FIG. 7. In a conventional display panel test device, a number of display panels 71 flowing in FIG. 7 is 20, a number of display panels 72 fails the alignment is 17, and an alignment failure probability is 85.00%. After use of the display panel test device and the display panel test method provided in the present application, the alignment failure probability is 0, which improves an alignment success rate of the display panel and improves the efficiency in manufacturing the display panel.

According to the above embodiments:

The present application provides a display panel test method and a display panel test device. The display panel test method comprises: obtaining position information of a display panel; automatically searching for an alignment mark on the display panel according to the position information of the display panel; determining whether to allow automatically searching again for the alignment mark on the display panel when the alignment mark on the display panel is not found; searching again for the alignment mark on the display panel when automatically searching again for the alignment mark on the display panel is allowed; issuing a first warning when a number of times of searching again for the alignment mark on the display panel is greater than a preset value; choosing to search again for the alignment mark on the display panel or proceeding to a next operation after the first warning is issued; manually adjusting a position of the alignment mark on the display panel after choosing to proceed to the next operation; and performing a test process after the alignment mark on the display panel is successfully aligned. The present application automatically searches for the alignment mark of the display panel, and can automatically adjust the position of the alignment mark of the display panel after the alignment mark of the display panel is automatically found. The alignment mark of the display panel can be manually adjusted when the position of the alignment mark of the display panel cannot be adjusted automatically. As a result, there is no need to conduct monitoring by manpower. In addition to that, after the alignment mark is found, there is no need to remove the display panel, and the position of the alignment mark can be directly adjusted automatically or adjusted manually, thereby reducing manpower and eliminating a need to repeatedly remove and then reload the display panel. This solves a technical problem that repeated operations are required after failure to find a mark in a conventional display panel test process, which leads to low efficiency in manufacturing the display panel.

In the above-mentioned embodiments, the description of each embodiment has its own emphasis. For those that are not described in detail in one embodiment, reference may be made to related descriptions of other embodiments.

The above is a detailed description about the display panel test method and the display panel test device of the present application. Specific examples are used in the present disclosure to illustrate working principles and embodiments of the present application. The descriptions of the above embodiments are only used for ease of understanding technical solutions and main ideas of the present application. Those of ordinary skill in the art should understand that modifications can be made to the technical solutions described in the foregoing embodiments, or equivalent replacements can be made for some of the technical features in the embodiments. Such modifications or replacements do not make essence of corresponding technical solutions deviate from the protection scope of the technical solutions of the embodiments of the present application.

What is claimed is:

1. A display panel test method, comprising following steps:

obtaining position information of a display panel;

automatically searching for an alignment mark on the display panel according to the position information of the display panel;

determining whether to allow automatic searching again for the alignment mark on the display panel when the alignment mark on the display panel is not found;

searching again for the alignment mark on the display panel when automatically searching again for the alignment mark on the display panel is allowed;

issuing a first warning when a number of times of searching again for the alignment mark on the display panel is greater than a preset value;

choosing to search again for the alignment mark on the display panel or proceeding to a next operation after the first warning is issued;

adjusting a position of the alignment mark on the display panel for aligning the alignment mark after choosing to proceed to the next operation; and performing a test process after the alignment mark on the display panel is successfully aligned.

2. The display panel test method according to claim 1, wherein the step of obtaining the position information of the display panel comprises:

searching for the display panel at a specific frequency; and obtaining the position information of the display panel when the display panel enters a test range.

3. The display panel test method according to claim 2, wherein the step of automatically searching for the alignment mark on the display panel according to the position information of the display panel comprises:

determining coordinates of the display panel according to the position information of the display panel;

setting a search rule according to the coordinates of the display panel; and automatically searching for the alignment mark on the display panel according to the search rule.

4. The display panel test method according to claim 1, wherein after the step of determining whether to allow automatic searching again for the alignment mark on the display panel, when the alignment mark on the display panel is not found, the display panel test method further comprises:

choosing to proceed to the next operation when automatically searching again for the alignment mark on the display panel is forbidden.

5. The display panel test method according to claim 1, wherein the step of determining whether to allow automatic searching again for the alignment mark on the display panel when the alignment mark on the display panel is not found comprises:

issuing a second warning when the alignment mark on the display panel is not found; and determining whether to allow automatic searching again for the alignment mark on the display panel after the second warning is received.

6. The display panel test method according to claim 5, wherein the step of issuing the second warning when the alignment mark on the display panel is not found comprises:

displaying different colors on data when the alignment mark on the display panel is not found.

7. The display panel test method according to claim 5, wherein the step of issuing the second warning when the alignment mark is not found further comprises:

proceeding to the next operation after the second warning is received.

8. The display panel test method according to claim 1, wherein after the step of searching again for the alignment mark on the display panel when automatically searching again for the alignment mark on the display panel is allowed, the display panel test method further comprises:

searching again for the alignment mark on the display panel when the number of times of searching again for the alignment mark on the display panel is less than or equal to the preset value.

9. The display panel test method according to claim 1, wherein after the step of searching again for the alignment mark on the display panel, when automatically searching again for the alignment mark on the display panel is allowed, the display panel test method further comprises:

recording coordinates of the alignment mark on the display panel after the alignment mark on the display panel is found; and automatically adjusting the position of the alignment mark on the display panel after the coordinates of the alignment mark on the display panel are recorded.

10. The display panel test method according to claim 9, wherein after the step of adjusting the position of the alignment mark on the display panel after the coordinates of the alignment mark of the display panel are recorded, the display panel test method further comprises:

determining a search range;

matching parameters of the alignment mark on the display panel according to the search range; and confirming that the display panel is fixed when the parameters of the alignment mark on the display panel match correctly.

11. The display panel test method according to claim 1, wherein after the step of choosing to search again for the alignment mark on the display panel or proceeding to the next operation after the first warning is issued, the display panel test method further comprises:

automatically searching for the alignment mark on the display panel after choosing to search again for the alignment mark on the display panel.

12. The display panel test method according to claim 1, wherein the step of adjusting the position of the alignment mark on the display panel after choosing to proceed to the next operation comprises:

adjusting the position of the alignment mark on the display panel;

determining coordinates of the alignment mark on the display panel for aligning the alignment mark after the position of the alignment mark on the display panel is adjusted; and searching again for the alignment mark on the display panel after coordinates of the display panel are determined.

13. The display panel test method according to claim 12, wherein after the step of determining the coordinates of the alignment mark on the display panel after the position of the alignment mark on the display panel is adjusted, the display panel test method further comprises:

correcting previous coordinates of the alignment mark on the display panel according to the coordinates of the alignment mark on the display panel.

14. The display panel test method according to claim 13, wherein after the step of searching again for the alignment mark on the display panel after the coordinates of the display panel are determined, the display panel test method further comprises:

performing the test process after the alignment mark on the display panel is found again.

15. A display panel test device, comprising:

a position information acquisition module configured to obtain position information of the display panel;

a first search module configured to automatically search for an alignment mark on the display panel according to the position information of the display panel;

a judging module configured to determine whether to allow automatic searching again for the alignment mark on the display panel when the alignment mark on the display panel is not found;

a second search module configured to search again for the alignment mark on the display panel when automatically searching again for the alignment mark on the display panel is allowed;

a first warning module configured to issue a first warning when a number of times of searching again for the alignment mark on the display panel is greater than a preset value;

a selection module configured to choose to search again for the alignment mark on the display panel or proceeding to a next operation after the first warning is issued;

a manual adjustment module configured to adjust a position of the alignment mark on the display panel for aligning the alignment mark after choosing to proceed to the next operation; and a test module configured to perform a test process after the alignment mark on the display panel is successfully aligned.

16. The display panel test device according to claim 15, wherein the position information acquisition module is configured to search for the display panel at a specific frequency; and the position information of the display panel is obtained when the display panel enters a test range.

17. The display panel test device according to claim 16, wherein the first search module is configured to determine coordinates of the display panel according to the position information of the display panel, set a search rule according to the coordinates of the display panel, and automatically search for the alignment mark on the display panel according to the search rule.

18. The display panel test device according to claim 15, wherein the judging module is configured to choose to proceed to the next operation when automatically searching again for the alignment mark on the display panel is forbidden.

19. The display panel test device according to claim 15, wherein the judging module is configured to issue a second warning when the alignment mark on the display panel is not found, and determine whether to allow automatic searching again for the alignment mark on the display panel when the second warning is received.

20. The display panel test device according to claim 19, wherein the judging module is configured to display different colors on data when the alignment mark on the display panel is not found.

* * * * *